United States Patent
Hong et al.

(10) Patent No.: US 8,314,028 B2
(45) Date of Patent: Nov. 20, 2012

(54) SLURRY COMPOSITIONS AND METHODS OF POLISHING A LAYER USING THE SLURRY COMPOSITIONS

(75) Inventors: Gi-Sik Hong, Gyeonggi-do (KR); Dong-Jun Lee, Seoul (KR); Nam-Soo Kim, Gyeonggi-do (KR); Kyoung-Moon Kang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1293 days.

(21) Appl. No.: 11/853,735

(22) Filed: Sep. 11, 2007

(65) Prior Publication Data
US 2008/0081542 A1    Apr. 3, 2008

(30) Foreign Application Priority Data
Sep. 28, 2006    (KR) .................. 10-2006-0094755

(51) Int. Cl.
*H01L 21/461*    (2006.01)
*C09K 13/00*    (2006.01)
(52) U.S. Cl. ........ 438/692; 252/79.1; 252/79.4; 451/37; 438/689; 438/691; 438/693
(58) Field of Classification Search .................. 252/79.1, 252/79.4, 79.2, 79.3; 438/692, 689, 691, 438/693; 451/37
See application file for complete search history.

(56) References Cited

U.S. PATENT DOCUMENTS

| | | | | |
|---|---|---|---|---|
| 5,665,202 A | * | 9/1997 | Subramanian et al. | 438/692 |
| 6,410,444 B1 | * | 6/2002 | Kido et al. | 438/693 |
| 6,435,942 B1 | * | 8/2002 | Jin et al. | 451/8 |
| 6,936,543 B2 | * | 8/2005 | Schroeder et al. | 438/692 |
| 7,163,448 B2 | * | 1/2007 | Hattori et al. | 451/57 |
| 7,696,095 B2 | * | 4/2010 | Oswald et al. | 438/693 |
| 7,713,879 B2 | * | 5/2010 | Kim et al. | 438/692 |
| 2003/0228763 A1 | * | 12/2003 | Schroeder et al. | 438/691 |
| 2004/0142640 A1 | * | 7/2004 | Prabhu et al. | 451/41 |

(Continued)

FOREIGN PATENT DOCUMENTS

KR    2002-0040636    5/2002
(Continued)

OTHER PUBLICATIONS

English language abstract of Korean Publication No. 2002-0040636.
(Continued)

*Primary Examiner* — Nadine G Norton
*Assistant Examiner* — Christopher Remavege
(74) *Attorney, Agent, or Firm* — Harness, Dickey & Pierce, P.L.C.

(57) ABSTRACT

In a slurry composition and a method of polishing a layer using the slurry composition, the slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water. The slurry composition including the nonionic surfactant and the polish accelerating agent may be used for speedily polishing a stepped upper portion of a silicon oxide layer, and may also enable a lower portion of the silicon oxide layer to function as a polish stop layer.

21 Claims, 3 Drawing Sheets

U.S. PATENT DOCUMENTS

| | | | |
|---|---|---|---|
| 2005/0056368 A1* | 3/2005 | Schroeder et al. | 156/345.12 |
| 2005/0142988 A1 | 6/2005 | Kim et al. | |
| 2005/0196965 A1 | 9/2005 | Kim et al. | |
| 2006/0118760 A1* | 6/2006 | Yang et al. | 252/79.1 |
| 2006/0148205 A1* | 7/2006 | Akiba et al. | 438/424 |
| 2006/0216935 A1* | 9/2006 | Oswald et al. | 438/691 |
| 2007/0090094 A1* | 4/2007 | Thompson et al. | 216/89 |
| 2008/0105652 A1* | 5/2008 | Brusic et al. | 216/89 |
| 2009/0156006 A1* | 6/2009 | Anjur et al. | 438/693 |

FOREIGN PATENT DOCUMENTS

| | | |
|---|---|---|
| KR | 2005-0122754 | 12/2005 |

OTHER PUBLICATIONS

English language abstract of Korean Publication No. 2005-0122754.

* cited by examiner

SLURRY COMPOSITIONS AND METHODS OF POLISHING A LAYER USING THE SLURRY COMPOSITIONS

CROSS-REFERENCE TO RELATED APPLICATIONS

This application claims priority under 35 U.S.C. §119 to Korean Patent Application No. 2006-94755, filed on Sep. 28, 2006, the contents of which are herein incorporated by reference in their entireties.

BACKGROUND OF THE INVENTION

1. Field of the Invention

Example embodiments of the present invention relate to slurry compositions and methods of polishing a layer using the slurry compositions. More particularly, example embodiments of the present invention relate to slurry compositions used for performing a high-planarity polishing process, and methods of polishing a layer using the slurry compositions.

2. Description of the Related Art

In manufacturing a semiconductor memory device, structures having a level upper face are required to be formed on a semiconductor substrate. The structures are generally formed by performing several processes such as a deposition process, a patterning process, an etching process, a polishing process, etc. Particularly, a chemical mechanical polishing (CMP) process is frequently used for forming the structures.

In the CMP process, a semiconductor substrate to be polished is located on a wafer carrier, and then a slurry composition including an abrasive is provided to a polishing pad. While the semiconductor substrate is in contact with the polishing pad, the semiconductor substrate and the polishing pad are rotated together and pressurized. As a result of polishing the semiconductor substrate, a surface of the semiconductor substrate is planarized. Particularly, the surface of the semiconductor substrate is mechanically polished by rubbing the surface of the semiconductor substrate with the abrasive included in the slurry composition and a rugged surface of the polishing pad. Simultaneously, the surface of the semiconductor substrate is chemically polished by reacting chemical components of the slurry composition with surface substances of the semiconductor substrate.

The polishing efficiency of the CMP process may be determined by the CMP apparatus, the chemical composition of the slurry composition, the type of the polishing pad, etc. The chemical composition of the slurry composition may have an important effect on the polishing efficiency.

A single slurry composition may exhibit different polishing rates between various layers in accordance with properties or types of layers to be polished. Thus, layers are selectively polished, for example, one of an oxide layer, a nitride layer, a polysilicon layer and a metal layer, which are widely used in manufacturing a semiconductor device, may be selectively polished during the CMP process by using the differences in the polishing rates.

A high planarity slurry chemical mechanical polishing (HPS-CMP) process has been developed so as to improve a planarity of a layer having a highly stepped upper portion. A slurry composition including a passivating agent such as an ionic surfactant may be used for performing the HPS-CMP process.

In the HPS-CMP process, the ionic surfactant in the slurry composition may be electrically adsorbed onto a surface of a silicon oxide layer to form a polish stop layer on the silicon oxide layer. Therefore, a chemical polishing process may be suppressed from being performed, so that a mechanical polishing process may be mainly performed in the HPS-CMP process. A stepped upper portion of the silicon oxide layer is mechanically polished from a top surface thereof. As the silicon oxide layer is planarized, a contact area between the silicon oxide layer and the polishing pad may increase, and a polishing pressure applied to the silicon oxide layer may be dispersed. Due to the dispersion of the polishing pressure, a polishing rate of the silicon oxide layer may be greatly reduced and the planarized silicon oxide layer may function as a polish stop layer. Therefore, the silicon oxide layer having a high planarity may be formed through the HPS-CMP process. However, when the HPS-CMP process is performed on a layer including a high height portion formed on dense structures and a low height portion formed on sparse structures adjacent to the dense structures, the HPS-CMP process may not exhibit the polish stop characteristics, and thus the structures formed on a substrate may be damaged. Furthermore, the HPS-CMP process may require a polishing time, which is about four to about five times longer than that of a conventional CMP process, and thus the HPS-CMP process has not been considered economically acceptable.

Therefore, there have been ongoing researches to develop slurry compositions that may be used for polishing a layer with a high planarity through the HPS-CMP process and reduce a polishing thereof, however methods of developing such slurry compositions have not been found yet.

SUMMARY OF THE INVENTION

Example embodiments of the present invention provide slurry compositions that may be used for polishing a layer with a high planarity and may reduce a polishing time.

Example embodiments of the present invention also provide methods of polishing a layer using the above-mentioned slurry compositions.

According to one aspect of the present invention, a slurry composition used for a CMP process includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water.

In an example embodiment of the present invention, the abrasive may have an average particle size in a range of from about 100 to 400 nm. Examples of the abrasive may include silica, ceria, zirconia, alumina, titania, etc.

Examples of the ionic surfactant may include polyacrylic acid, poly (acrylic acid-co-maleic acid), polyacrylamide, poly(acrylamide-co-acrylic acid), polyethylene glycol behenyl ether methacrylate, polyethylene glycol diacid, etc. These can be used alone or in a combination thereof.

Examples of the nonionic surfactant may include a polyoxyethylene ether, a polyoxyethylene ester, a sorbitan fatty acid ester, etc. Examples of the amino acid compound may include glutamic acid, aspartic acid or a combination thereof.

Examples of the basic pH-controlling agent may include tetraethylammonium hydroxide, tetramethylammonium hydroxide, tetrabutylammonium hydroxide, tetrapropylammonium hydroxide, etc.

In an example embodiment of the present invention, the slurry composition may have a pH of from about 4 to 6.5.

According to another aspect of the present invention, there is provided a method of polishing a layer. In the method of polishing the layer, a first polishing process is performed using a slurry composition on a silicon oxide layer including a first portion having a first height and a second portion having a second height substantially lower than the first height to thereby partially remove the first portion before a polishing pressure is substantially applied to the second portion. A second polishing process is performed on the silicon oxide layer using the slurry composition until the second portion functions as a polish stop layer. Here, the slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water.

In an example embodiment of the present invention, the first polishing process may be performed under a polishing pressure of from about 4.5 to 8 psi, and the second polishing process may be performed under a polishing pressure of from about 1.5 to 4 psi.

According to another aspect of the present invention, there is provided a method of polishing a layer. In the method of polishing the layer, a silicon oxide layer formed on a substrate having a structure is prepared. The silicon oxide layer includes a first portion having a first height substantially higher than a height of the structure and a second portion having a second height substantially lower than the first height. A first polishing process is performed on the silicon oxide layer using a slurry composition to partially remove the first portion before a polishing pressure is substantially applied to the second portion. A second polishing process is performed on the silicon oxide layer using the slurry composition until a polishing pressure is substantially applied to the second portion that functions as a polish stop layer. Here, the slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water.

In an example embodiment of the present invention, the first portion of the silicon oxide layer may be formed in a cell region of the substrate, and the second portion of the silicon oxide layer may be formed in a peripheral region of the substrate. The structure may include a capacitor that may be electrically connected to an impurity region of a transistor.

According to the present invention, the slurry composition including a polish accelerating agent may speedily polish a silicon oxide layer having a stepped upper portion under a low polishing pressure of from about 4 to 4.5 psi to thereby reduce the polishing time by at least about 30%, preferably at least about 35%, and more preferably at least about 45%. Additionally, damages to a polishing apparatus, which is used for polishing the silicon oxide layer, may be suppressed due to the low polishing pressure. Furthermore, the slurry composition may enable the silicon oxide layer to function as a polish stop layer, and thus a polishing amount of a lower portion of the silicon oxide layer may be reduced. The slurry composition may be widely used for polishing an oxide layer in a semiconductor manufacturing process.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE INVENTION

Figure 1:
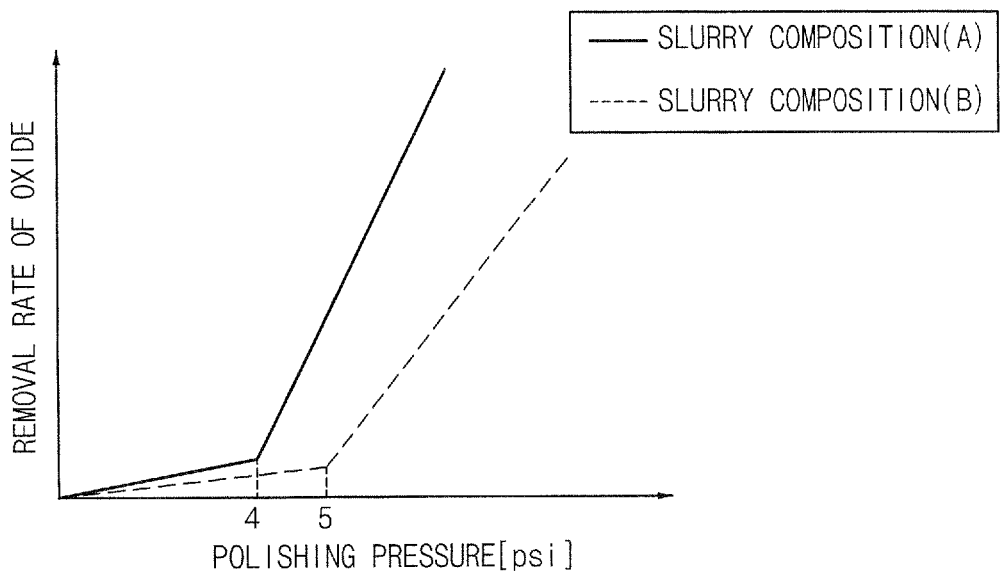
FIG. 1 is a graph illustrating polishing characteristics of slurry compositions in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Slurry Composition

A slurry composition according to the present invention may rapidly remove an upper portion of an object layer to be polished, compared with a high planarity slurry composition that has been conventionally used. The slurry composition may also planarize the object layer having a stepped upper portion so as to have a high planarity, and may enhance polish stopping characteristics of a lower portion of the object layer. The object layer to be polished may be a silicon oxide layer having a stepped upper portion. The slurry composition having the above-mentioned characteristics includes an abrasive, an ionic surfactant, a nonionic surfactant, a polish accelerating agent and an aqueous solution having a basic pH-controlling agent and water.

Accordingly, the slurry composition may improve a removal rate of a stepped upper portion of the object layer in a CMP process. For example, the slurry composition may have polishing characteristics as illustrated in FIG. 1.

FIG. 1 is a graph illustrating polishing characteristics of slurry compositions in accordance with example embodiments of the present invention.

Referring to FIG. 1, a slurry composition (A) includes a nonionic surfactant and a polish accelerating agent, and thus the slurry composition has a low threshold polishing pressure of about 4 psi and exhibits a rapid increase of an oxide removal rate under a polishing pressure of about 4 to 4.5 psi. However, a conventional slurry composition (B), which includes an ionic surfactant without the nonionic surfactant and the polish accelerating agent, has a high threshold polishing pressure of about 5 psi, and shows a slow increase of an oxide removal rate under a polishing pressure of at least about 5 psi.

The abrasive included in the slurry composition may be used for mechanically polishing the object layer such as a silicon oxide layer having a stepped upper portion. Examples of the abrasive may include silica, ceria, zirconia, alumina, titania, etc. These can be used alone or in a combination thereof.

When the slurry composition includes less than about 3 percent by weight of the abrasive, a polishing rate of a stepped upper portion of a silicon oxide layer may be very low, and agglomeration of the abrasive may occur. In addition, when the amount of the abrasive is greater than about 20 percent by weight, a polishing rate of the stepped upper portion of the silicon oxide layer may rapidly increase, but the slurry composition may not exhibit a polish stop characteristic at a lower portion of the silicon oxide layer. Thus, the slurry composition may include the abrasive in a range of from about 3 to 20 percent by weight, and preferably from about 5 to 15 percent by weight.

In example embodiments of the present invention, the silicon oxide layer may have a first portion having a first height formed in a cell region of a substrate and a second region having a second height formed in an edge region or a peripheral region of the substrate. Here, the second height may be substantially lower than the first height.

Additionally, a particle size and an amount of the abrasive included in the slurry composition may affect a polishing efficiency of a polishing process. When the particle size of the abrasive is too large, a polishing rate of the silicon oxide layer may excessively increase. Thus, it may be difficult to precisely control the polishing process, and a polish stop characteristic at a lower portion of the silicon oxide layer may be reduced. When the particle size of the abrasive is too small, the polishing rate of the silicon oxide layer may decrease and a time required for performing the polishing process may disadvantageously increase. Therefore, the abrasive may preferably have a particle size of from about 50 nm to 400 nm, and more preferably a particle size of from about 120 nm to 200 nm.

The slurry composition according to the present invention includes an ionic surfactant. The ionic surfactant may adsorb onto an object layer such as a silicon oxide layer to form a first passivation layer on the object layer. Furthermore, the ionic surfactant may prevent particles of the abrasive from agglomerating in the slurry composition.

Examples of the ionic surfactant may include polyacrylic acid, poly (acrylic acid-co-maleic acid), polyacrylamide, poly(acrylamide-co-acrylic acid), polyethylene glycol behenyl ether methacrylate, polyethylene glycol diacid, etc. These ionic surfactants can be used alone or in a combination thereof.

In example embodiments of the present invention, the slurry composition may include polyacrylic acid having an average molecular weight of from about 2,000 to 25,000 as the ionic surfactant.

When the slurry composition includes less than about 0.1 percent by weight of the ionic surfactant, the first passivation layer may not be easily formed on the silicon oxide layer and thus the lower portion of the silicon oxide layer may be rapidly polished not to function as a polish stopping layer. In addition, when the amount of the ionic surfactant is greater than about 3 percent by weight, a polishing rate of an upper portion of the silicon oxide layer may be reduced. Therefore, the slurry composition may include the ionic surfactant in a range of from about 0.1 to 3 percent by weight, and preferably from about 0.04 to 1.5 percent by weight.

The slurry composition according to the present invention includes a nonionic surfactant. The nonionic surfactant may have a hydrophobic portion and a hydrophilic portion. The hydrophilic portion of the nonionic surfactant may be combined with the ionic surfactant adsorbed onto the silicon oxide layer to form a second passivation layer on the silicon oxide layer.

Particularly, the nonionic surfactant may not adsorb onto the silicon oxide layer, but the nonionic surfactant may be combined with the ionic surfactant to form the second passivation layer mainly on a lower top portion of the silicon oxide layer. The nonionic surfactant may hinder the abrasive from mechanically polishing the lower top portion of the silicon oxide layer and may suppress an excessive polishing of the lower top portion of the silicon oxide layer.

When the slurry composition includes less than about 0.01 percent by weight of the nonionic surfactant, mechanical polishing of the abrasive may not be sufficiently suppressed, and thus a polishing process to the lower portion thereof may not be stopped. Additionally, when the amount of the nonionic surfactant is greater than about 0.1 percent by weight, the slurry composition may generate foams due to an increased viscosity of the slurry composition, and a polishing rate of a stepped upper portion of the silicon oxide layer may be reduced. Therefore, the slurry composition may include the nonionic surfactant in a range of from about 0.01 to 0.1 percent by weight, and preferably from about 0.03 to 0.08 percent by weight.

Examples of the nonionic surfactant may include a polyoxyethylene ether, a polyoxyethylene ester, a sorbitan fatty acid ester, etc.

Examples of the polyoxyethylene ether may include polyoxyethylene glycol dodecyl ether, polyoxyethylene lauryl ether, polyoxyethylene cetyl ether, polyoxyethylene glycol hexadecyl ether, polyoxyethylene stearyl ether, polyoxyethylene glycol octadecyl ether, polyoxyethylene oleyl ether, polyoxyethylene isooctylphenyl ether, polyoxyethylene nonylphenyl ether, polyoxyethylene isooctylcyclohexyl ether, polyoxyethylene nonylcycloheyxl ether, etc. These polyoxyethylene ethers can be used alone or in a combination thereof.

In accordance with an example embodiment of the present invention, polyoxyethylene lauryl ether such as Brij 35 (a trade name manufactured by ICI Americas, Inc.) may have a chemical structure represented by Formula 1,

$$C_{12}H_{25}(OCH_2CH_2)_nOH \quad (1)$$

wherein n represents an integer ranging from 20 to 25.

In accordance with an example embodiment of the present invention, polyoxyethylene oleyl ether such as Brij 97 (a trade name manufactured by ICI Americas, Inc.) may have a chemical structure represented by Formula 2,

$$C_{18}H_{35}(OCH_2CH_2)_nOH \quad (2)$$

wherein n represents an integer ranging from 8 to 12.

In accordance with an example embodiment of the present invention, polyoxyethylene isooctylphenyl ether such as Triton X-100 (a trade name manufactured by Union Carbide Corp.) may have a chemical structure represented by Formula 3,

$$4\text{-}(C_8H_{17})C_6H_4(OCH_2CH_2)_nOH \quad (3)$$

wherein n represents an integer ranging from 8 to 12,

In accordance with an example embodiment of the present invention, polyoxyethylene isooctylphenyl ether such as Triton X-405 (a trade name manufactured by Union Carbide Corp.) may have a chemical structure represented by Formula 4.

$$4\text{-}(C_8H_{17})C_6H_4(OCH_2CH_2)_nOH \quad (4)$$

wherein n represents an integer ranging from 35 to 45.

Examples of the polyoxyethylene ester may include polyoxyethylene sorbitan monolaurate, polyoxyethylene sorbitan monopalmitate, polyoxyethylene sorbitan monostearate, polyoxyethylene sorbitan trioleate, etc. These polyethylene esters can be used alone or in a combination thereof.

Examples of the sorbitan fatty acid ester may include sorbitan monooleate, sorbitan monostearate, sorbitan monopalmitate, sorbitan sesquioleate, sorbitan trioleate, sorbitan monolaurate, etc. These sorbitan fatty acid esters can be used alone or in a combination thereof.

The slurry composition according to the present invention includes a polish accelerating agent such as an amino acid compound. In example embodiments of the present invention, an amino acid compound having two carboxylic groups may be used as the polish accelerating agent.

The amino acid compound may adsorb onto the abrasive such as a ceria abrasive to positively charge a surface of the abrasive and to enhance the zeta potential of the abrasive. An increased surface charge of the abrasive may generate an attraction force between the silicon oxide layer and the abrasive to raise the polishing rate of the silicon oxide layer. For example, a carboxylic group of the amino acid compound may be attached to the surface of the abrasive, and the abrasive may have a positive charge due to an amino group of the amino acid compound.

When the amount of the polish accelerating agent included in the slurry composition is less than about 0.01 percent by weight, an increase of the zeta potential of the abrasive may not be sufficient and the attraction force between the silicon oxide layer and the abrasive may be too weak. Accordingly, a polishing rate of the upper portion of the silicon oxide layer may be reduced. When the amount of the polish accelerating agent is greater than about 1 percent by weight, the attraction force between the silicon oxide layer and the abrasive may increase, but the abrasive may adsorb onto a surface of the silicon oxide layer to generate unintended particles on a semiconductor substrate after performing the polishing process. Therefore, the slurry composition may include the polish accelerating agent in a range of from about 0.01 to 1 percent by weight, and preferably from about 0.03 to 0.3 percent by weight.

Examples of the amino acid compound having two carboxylic groups may include glutamic acid, aspartic acid or a combination thereof.

Figure 2:
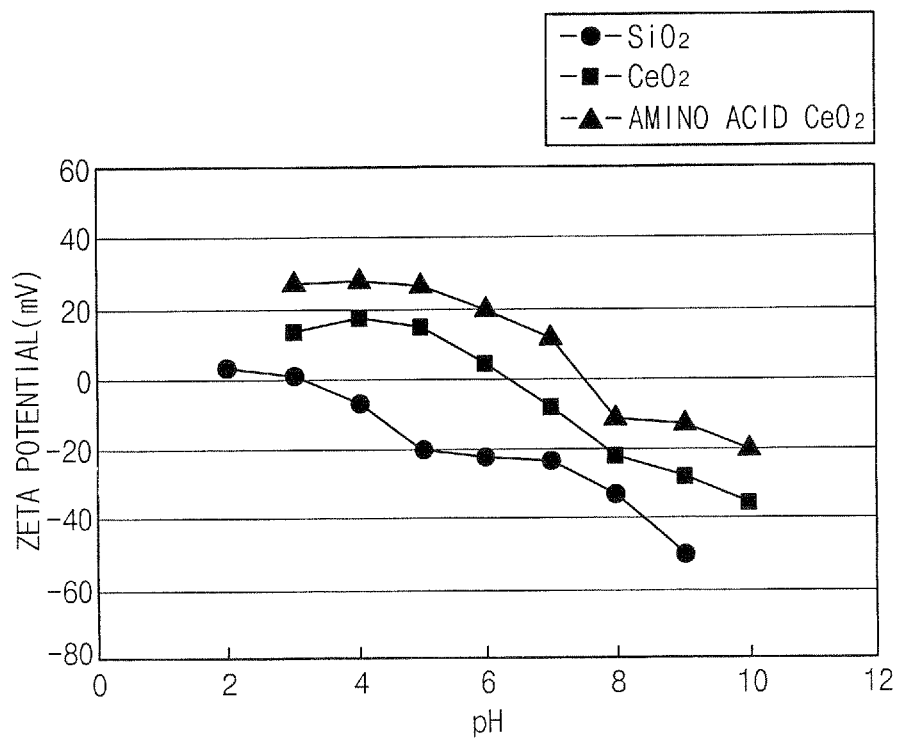
FIG. 2 is a graph illustrating a zeta potential variation of an abrasive according to use of an amino acid compound.

FIG. 2 is a graph illustrating a zeta potential variation of the abrasive according to use of the amino acid compound. In FIG. 2, a first graph indicated with a plurality of (●) symbols shows a zeta potential variation of a silicon oxide layer according to pH values, a second graph indicated with a plurality of (■) symbols denotes a zeta potential variation of a ceria abrasive according to pH values, and a third graph indicated with a plurality of (▲) symbols represents a zeta potential variation of a ceria abrasive to which an amino acid compound is attached according to pH values.

Referring to FIG. 2, a ceria abrasive may have an isoelectric point of a zeta potential between a pH range of from about 4 and 7, to thereby minimally have an electrical charge. Additionally, the silicon oxide ($SiO_2$) layer may have a negative charge between a pH range of from about 4 and 7. However, a ceria abrasive to which the amino acid compound is attached may have a positive charge in the pH range of from about 4 to 7. Therefore, the positive ceria abrasive to which the amino acid compound is attached may be attracted to the negative silicon oxide layer by an electrical attraction force. This attraction force may increase the contact area between the abrasive and the silicon oxide layer to improve the polishing rate of the silicon oxide layer. The amino acid compound having a dicarboxylic group may be advantageously used as the polish accelerating agent, compared with an amino acid compound having a monocarboxylic group.

The slurry composition according to the present invention includes an aqueous solution including a basic pH-controlling agent and water. Water may properly adjust a viscosity of the slurry composition during a polishing process. When the viscosity of the slurry composition is too high, a CMP apparatus used in the polishing process may be damaged. In addition, when the viscosity of the slurry composition is too low, the mechanical polishing efficiency of a silicon oxide layer may be substantially reduced.

The basic pH-controlling agent may adjust the pH value of the slurry composition, which includes the ionic surfactant having an acidity and the nonionic surfactant, in a range of from about 4 to 7, and preferably from about 5 to 6.5. Examples of the basic pH-controlling agent may include tetraethylammonium hydroxide, tetramethylammonium hydroxide, tetrabutylammonium hydroxide, tetrapropylammonium hydroxide, etc. These basic pH-controlling agents may be used alone or in a combination thereof.

When the slurry composition has a pH value of from about 5 to 6.5, the slurry composition may have excellent polishing characteristics. According to the present invention, the slurry composition including the nonionic surfactant and the polish accelerating agent may reduce the polishing time by at least about 30%, preferably at least about 35%, and more preferably at least about 45%.

The present invention will be further described through Example 1, and Comparative Examples 1 and 2 with regard to a preparation of the slurry composition.

Preparation of a Slurry Composition

EXAMPLE 1

A slurry composition was prepared by mixing about 3 percent by weight of a ceria abrasive, about 0.8 percent by weight of polyacrylic acid as an ionic surfactant, about 0.03 percent by weight of polyoxyethylene lauryl ether as a nonionic surfactant, about 0.05 percent by weight of glutamic acid as a polish accelerating agent, and a remainder of an aqueous solution including tetramethylammonium hydroxide as a basic pH-controlling agent and water. The slurry composition thus obtained had a pH of about 6.

COMPARATIVE EXAMPLE 1

A slurry composition was prepared by mixing about 3 percent by weight of a ceria abrasive, about 0.8 percent by weight of polyacrylic acid as an ionic surfactant and a remainder of an aqueous solution including tetramethylammonium hydroxide as a basic pH-controlling agent and water. The slurry composition thus obtained had a pH of about 6.

COMPARATIVE EXAMPLE 2

A slurry composition was prepared by mixing about 3 percent by weight of a ceria abrasive, about 0.8 percent by weight of polyacrylic acid as an ionic surfactant, about 0.03 percent by weight of polyoxyethylene lauryl ether as a nonionic surfactant, and a remainder of an aqueous solution including tetramethylammonium hydroxide as a basic pH-controlling agent and water. The slurry composition thus obtained had a pH of about 6.

Evaluation of a Polishing Time According to Amounts of a Nonionic Surfactant and a Polish Accelerating Agent To evaluate the polishing time according to amounts of a nonionic surfactant and a polish accelerating agent, substrates on which silicon oxide layers having stepped upper portions were formed were prepared. Each substrate included a cell region and a peripheral region, and the silicon oxide layer was formed to have substantially different heights between the cell region and the peripheral region. A CMP process was performed on each substrate using one of the slurry compositions prepared in Example 1 and Comparative Examples 1 and 2. The CMP process was carried out using Reflexion (a trade name manufactured by AMAT). About 93 rpm of a rotational speed of a platen, about 87 rpm of a rotational speed of a head, about 4.5 psi of a down force pressure, and about 1.5 psi of a back pressure were employed to perform the CMP process.

Figure 3:
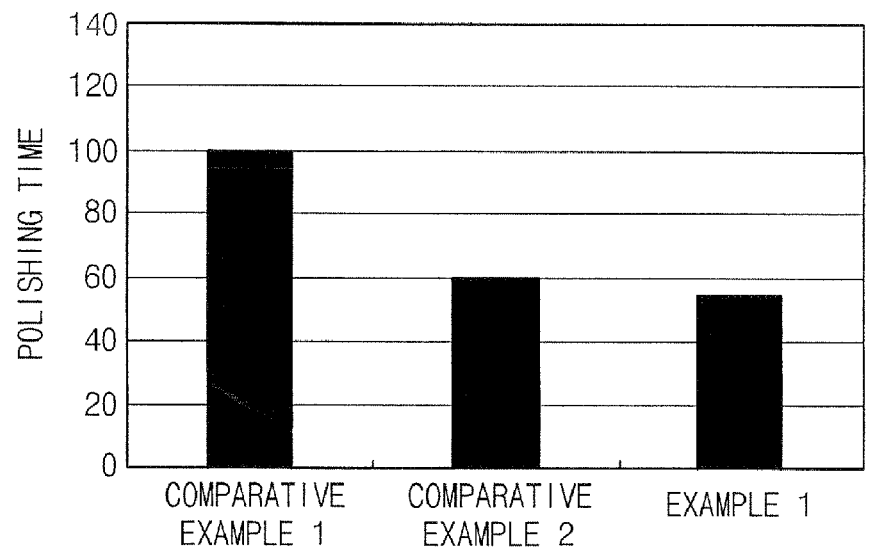
FIG. 3 is a graph illustrating a polishing time of a silicon oxide layer having a stepped upper portion, which was polished using one of slurry compositions prepared in Example 1, and Comparative Examples 1 and 2.

FIG. 3 is a graph illustrating the polishing time of a silicon oxide layer having a stepped upper portion, which was polished using one of slurry compositions prepared in Example 1, and Comparative Examples 1 and 2.

Referring to FIG. 3, the silicon oxide layer having a height difference of about 3,000 Å was planarized within about 100 seconds when the slurry composition prepared in Comparative Example 1 was employed in the CMP process. However, the silicon oxide layer was planarized within about 55 seconds when the slurry composition prepared in Example 1 was used in the CMP process. When the slurry composition prepared in Comparative Example 2 was used, the silicon oxide layer was planarized within about 61 seconds. Therefore, it may be noted that the slurry composition including the nonionic surfactant and the polish accelerating agent may have an enhanced polishing rate.

Method of Polishing a Layer

Figure 4:
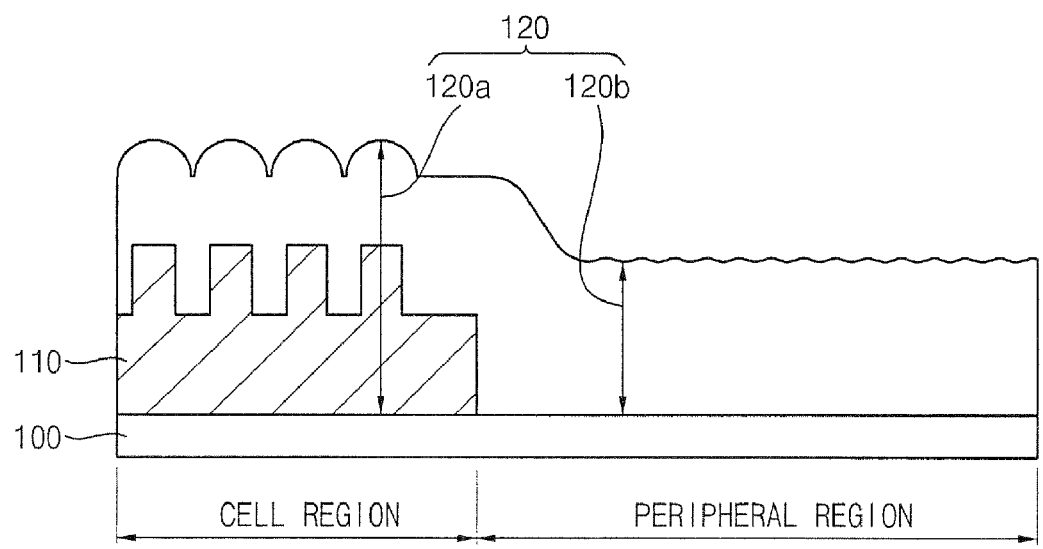
FIGS. 4 and 5 are cross-sectional views illustrating a method of polishing a layer in accordance with example embodiments of the present invention.
Figure 5:
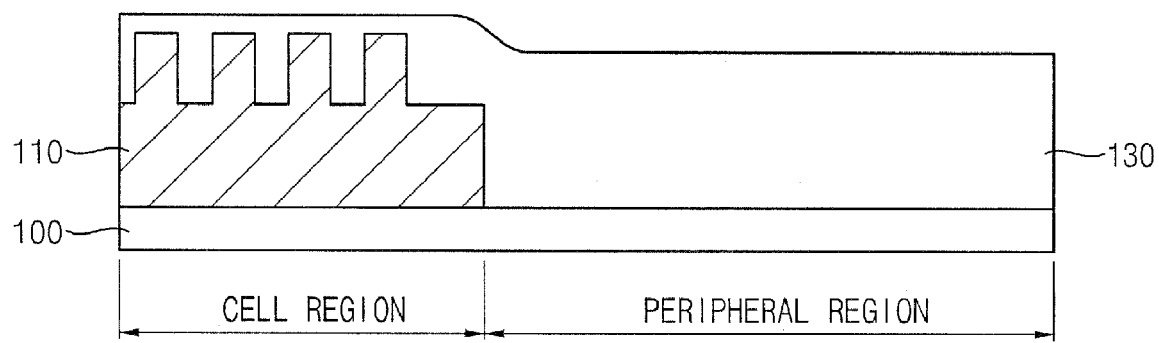

FIGS. 4 and 5 are cross-sectional views illustrating a method of polishing a layer in accordance with example embodiments of the present invention.

Referring to FIG. 4, a substrate 100, on which a layer 120 having a stepped upper portion is formed, is prepared.

In example embodiments of the present invention, the substrate 100 may be a silicon substrate having a cell region and a peripheral region. Additionally, a structure 110 such as an electrode, a conductive layer, a conductive layer pattern, an insulation layer, a metal wiring and/or an insulation layer pattern may be formed in cell region of the substrate 100.

In one example embodiment of the present invention, the layer 120 to be polished may be a silicon oxide layer that includes a first portion 120a having a first height and a second portion 120b having a second height substantially lower than the first height.

In another example embodiment of the present invention, the layer 120 to be polished may be formed on the substrate 100 having the cell region and the peripheral region to cover the structure 110. The layer 120 may include a first portion 120a having a first height that may be substantially higher than a height of the structure 110, and a second portion 120b having a second height substantially lower than the first height. Here, the first portion 120a may be formed in the cell region of the substrate 100, and the second portion 120b may be formed in the peripheral region of the substrate 100.

In example embodiments of the present invention, the layer 120 may be a silicon oxide layer formed by a plasma-enhanced chemical vapor deposition (PECVD) process or a high density plasma chemical vapor deposition (HDP-CVD)

process. Examples of a silicon oxide may include borophosphorsilicate glass (BPSG), phosphorsilicate glass (PSG), undoped silicate glass (USG), spin-on-glass (SOG), etc. Additionally, the layer 120 may be formed to have a thickness sufficient for covering the structure 10 formed in the cell region of the substrate 100.

Referring to FIG. 5, the first portion 120*a* of the layer 120 is polished by a first polishing process before a polishing pressure is substantially applied to the second portion 120*b*. The first polishing process may be performed at a first polishing rate using a slurry composition according to the present invention. As a result of the first polishing process, the layer 120 having a planarized first portion 120*a* may be obtained.

Particularly, the slurry composition according to the present invention may be provided to the polishing pad. The slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water. Then, the first portion 120*a* may be polished by making contact with the polishing pad to which the slurry composition is provided.

The first portion 120*a* may be polished until the polishing pad makes contact with the second portion 120*b*. In the first polishing process, a contact area between the polishing pad and the layer 120 may be small due to a stepped or uneven upper portion of the layer 120.

In some example embodiments of the present invention, the first polishing process may be performed under a polishing pressure of at least about 4.5 psi, for example, a pressure of from about 4.5 to 8 psi. Here, the first portion 120*a* may be planarized at a first polishing rate by a mechanical polishing process rather than a chemical polishing process. The first polishing rate may be faster than a polishing rate of a conventionally used slurry composition that does not include a nonionic surfactant and a polish accelerating agent. The slurry composition is previously described, so any further explanations in this regard will be omitted herein for brevity.

Subsequently, a second polishing process is performed on the layer 120 until the second portion 120*b* may function as a polish stop layer by applying the polishing pressure to the second portion 120*b*. When the polishing pressure is applied to the second portion 120*b*, the polishing pressure may be dispersed, and thus a polishing rate may be greatly reduced. Thus; the second portion 120*b* may function as a polish stop layer. As a result of the second polishing process, a planarized layer 130 is formed on the substrate 100.

Particularly, when the second polishing process is performed using the slurry composition according to the present invention, a height difference between the first portion 120*a* and the second portion 120*b* may be reduced, and a contact area between the polishing pad and the layer 120 may increase. Therefore, the polishing rates of the first portion 120*a* and the second portion 120*b* may greatly decrease, and thus the second portion 120*b* may be prevented from being excessively polished.

Additionally, the ionic surfactant and the nonionic surfactant included in the slurry composition may hinder the abrasive from mechanically polishing the layer 120 in the second polishing process, and thus a polish stop of the second polishing process may occur. Here, the ionic surfactant and the nonionic surfactant may adsorb onto a surface of the layer 120 such as a silicon oxide layer to form a passivation layer having a physically dense structure on the layer 120. Furthermore, the polish stop of the second polishing process may be also originated from a reduction of a polishing pressure that may be caused as the polishing pressure disperses into the first portion 120*a* and the second portion 120*b*.

The second polishing process may be performed on the planarized first portion 120*a* and the second portion 120*b* under a polishing pressure of from about 1.5 to 4 psi. The second polishing process may be also carried out at a second polishing rate that is substantially slower than the first polishing rate.

In some example embodiments of the present invention, the method of polishing a layer may be employed in planarizing an insulating interlayer formed on a gate structure, a wiring structure, a pad structure, a contact, a capacitor or a metal wiring.

According to example embodiments of the present invention, the slurry composition including a nonionic surfactant and a polish accelerating agent may speedily polish a silicon oxide layer having a stepped upper portion under a low polishing pressure of from about 4 to about 4.5 psi, to thereby reduce the polishing time as described above. Additionally, damages to a polishing apparatus, which is used in polishing the silicon oxide layer, may be suppressed owing to the low polishing pressure. Furthermore, the slurry composition may enable the silicon oxide layer to function as a polish stop layer, and thus a polishing amount of a lower portion of the silicon oxide layer may be reduced. The slurry may be widely used for polishing an oxide layer in a semiconductor manufacturing process.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of polishing a layer comprising:
   performing a first polishing process using a slurry composition on a silicon oxide layer including a first portion having a first height and a second portion having a second height substantially lower than the first height to thereby partially remove the first portion before a polishing pressure is applied to the second portion; and
   performing a second polishing process on the silicon oxide layer using the slurry composition until the second portion functions as a polish stop layer,
   wherein the slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water, and wherein the performing a second polishing process is conducted such that the first portion of the silicon oxide layer is not completely removed by the second polishing process and without reducing the first height to the second height.

2. The method of claim 1, wherein the first polishing process is performed under a polishing pressure from of about 4.5 to 8 psi, and the second polishing process is performed under a polishing pressure of from about 1.5 to 4 psi.

3. The method of claim 1, wherein the slurry composition has a pH of from about 4 to 6.5.

4. The method of claim 1, wherein the amino acid compound comprises glutamic acid, aspartic acid or a combination thereof.

5. A method of polishing a layer comprising:
preparing a silicon oxide layer formed on a substrate having a structure, the silicon oxide layer including a first portion having a first height substantially higher than a height of the structure and a second portion having a second height substantially lower than the first height;
performing a first polishing process on the silicon oxide layer using a slurry composition to partially remove the first portion before a polishing pressure is substantially applied to the second portion; and
performing a second polishing process on the silicon oxide layer using the slurry composition such that a polishing pressure is substantially applied until the second portion functions as a polish stop layer,
wherein the slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water, and
wherein the performing a second polishing process is conducted such that the first portion of the silicon oxide layer is not completely removed by the second polishing process and without reducing the first height to the second height.

6. The method of claim 5, wherein the first portion of the silicon oxide layer is formed in a cell region of the substrate, and the second portion of the silicon oxide layer is formed in a peripheral region of the substrate.

7. The method of claim 5, wherein the first polishing process is performed under a polishing pressure from of about 4.5 to 8 psi, and the second polishing process is performed under a polishing pressure of from about 1.5 to 4 psi.

8. The method of claim 5, wherein the slurry composition has a pH of from about 4 to 6.5.

9. The method of claim 5, wherein the amino acid compound comprises glutamic acid, aspartic acid or a combination thereof.

10. The method of claim 5, wherein the ionic surfactant comprises at least one of polyacrylic acid, poly (acrylic acid-co-maleic acid), polyacrylamide, poly(acrylamide-co-acrylic acid), polyethylene glycol behenyl ether methacrylate and polyethylene glycol diacid, and the nonionic surfactant comprises at least one of a polyoxyethylene ether, a polyoxyethylene ester and a sorbitan fatty acid ester.

11. The method of claim 1, wherein the amino acid compound comprises glutamic acid.

12. The method of claim 5, wherein the amino acid compound comprises glutamic acid.

13. The method of claim 1, further comprising:
forming a first passivation layer on the silicon oxide layer with the ionic surfactant.

14. The method of claim 13, further comprising:
forming a second passivation layer on the silicon oxide layer with the nonionic surfactant.

15. The method of claim 1, wherein the second portion of the silicon oxide layer remains lower than the first portion after the second polishing process.

16. The method of claim 5, further comprising:
forming a first passivation layer on the silicon oxide layer with the ionic surfactant.

17. The method of claim 16, further comprising:
forming a second passivation layer on the silicon oxide layer with the nonionic surfactant.

18. The method of claim 5, wherein the second portion of the silicon oxide layer remains lower than the first portion after the second polishing process.

19. The method of claim 1, wherein the first portion is formed in a cell region and the second portion is formed in a peripheral region.

20. The method of claim 5, wherein the first portion is formed in a cell region and the second portion is formed in a peripheral region.

21. A method of polishing a layer comprising:
performing a first polishing process using a slurry composition on a silicon oxide layer including a first portion having a first height and a second portion having a second height substantially lower than the first height to thereby partially remove the first portion before a polishing pressure is applied to the second portion; and
performing a second polishing process on the silicon oxide layer using the slurry composition until the second portion functions as a polish stop layer,
wherein the slurry composition includes from about 3 to 20 percent by weight of an abrasive, from about 0.1 to 3 percent by weight of an ionic surfactant, from about 0.01 to 0.1 percent by weight of a nonionic surfactant, from about 0.01 to 1 percent by weight of a polish accelerating agent including an amino acid compound, and a remainder of an aqueous solution including a basic pH-controlling agent and water,
wherein the second portion of the silicon oxide layer remains lower than the first portion after the second polishing process.

* * * * *